(12) United States Patent
Jain et al.

(10) Patent No.: US 11,848,672 B2
(45) Date of Patent: Dec. 19, 2023

(54) REDUNDANCY CIRCUIT

(71) Applicant: STMicroelectronics International N.V., Geneva (CH)

(72) Inventors: Sandeep Jain, Noida (IN); Jeena Mary George, Kattappana (IN)

(73) Assignee: STMicroelectronics International N.V., Geneva (CH)

( * ) Notice: Subject to any disclaimer, the term of this patent is extended or adjusted under 35 U.S.C. 154(b) by 49 days.

(21) Appl. No.: 17/719,004

(22) Filed: Apr. 12, 2022

(65) Prior Publication Data

US 2023/0327674 A1    Oct. 12, 2023

(51) Int. Cl.
| | |
|---|---|
| *H03K 19/23* | (2006.01) |
| *G01R 31/3185* | (2006.01) |
| *H03K 19/20* | (2006.01) |
| *H03K 19/00* | (2006.01) |
| *H03K 3/037* | (2006.01) |

(52) U.S. Cl.
CPC ..... *H03K 19/23* (2013.01); *G01R 31/318525* (2013.01); *G01R 31/318536* (2013.01); *H03K 3/037* (2013.01); *H03K 19/0021* (2013.01); *H03K 19/20* (2013.01)

(58) Field of Classification Search
CPC ......... H03K 19/0021; H03K 19/00392; H03K 19/0075; H03K 19/20; H03K 19/23; G01R 31/318525; G01R 31/318536
See application file for complete search history.

(56) References Cited

U.S. PATENT DOCUMENTS

| | | | | | |
|---|---|---|---|---|---|
| 6,127,864 | A  | * | 10/2000 | Mavis .................. | H03K 3/0375 327/295 |
| 6,480,019 | B2 | * | 11/2002 | Waldie ........... | G01R 31/318525 326/14 |
| 7,162,673 | B2 | * | 1/2007  | Wong ............. | G01R 31/318541 714/726 |
| 7,482,831 | B2 | * | 1/2009  | Chakraborty ........ | H03K 3/0375 326/11 |
| 11,296,700 | B1 | * | 4/2022  | Rao ...................... | H03K 3/0372 |
| 2006/0050550 | A1 | * | 3/2006  | Petersen ............. | G11C 11/4125 365/154 |

(Continued)

OTHER PUBLICATIONS

Alagoz, B., "Hierarchical Triple-Modular Redundancy (H-TMR) Network for Digital Systems," OncuBilim Algorithm and Systems Labs. vol. 08, Art. No. 05, Feb. 3, 2009, 15 pages.

(Continued)

*Primary Examiner* — Jason Crawford
(74) *Attorney, Agent, or Firm* — Slater Matsil, LLP (57) ABSTRACT

In an embodiment, an integrated circuit includes: a voting circuit including N scan flip-flops, where N is an odd number greater than or equal to 3, and where the N scan flip-flops includes a first scan flip-flop and a second scan flip-flop, where an output of the first scan flip-flop is coupled to a scan input of the second scan flip-flop; a scan chain including the N scan flip-flops of the voting circuit, and third and fourth scan flip-flops, the scan chain configured to receive a scan enable signal; and a scan enable control circuit configured to control a scan enable input of the first or second scan flip-flops based on the scan enable signal and based on a scan input of the third scan flip-flop or an output of the fourth scan flip-flop.

20 Claims, 5 Drawing Sheets

(56) References Cited

U.S. PATENT DOCUMENTS

| | | | | |
|---|---|---|---|---|
| 2007/0262787 A1* | 11/2007 | Chakraborty | ........ | H03K 3/0375 326/16 |
| 2011/0022908 A1* | 1/2011 | Wang | ............... | G01R 31/31816 714/E11.155 |
| 2011/0022909 A1* | 1/2011 | Wang | .................... | G06F 30/327 714/E11.155 |
| 2013/0055040 A1* | 2/2013 | Kimura | .......... | G01R 31/318541 714/E11.155 |
| 2015/0377962 A1* | 12/2015 | Daveau | ................. | G06F 11/267 714/729 |

OTHER PUBLICATIONS

Anjankar, S. et al., "Fault Tolerant and Correction System Using Triple Modular Redundancy," International Journal of Emerging Engineering Research and Technology, vol. 2, Issue 2, May 2014, 5 pages.

Habinc, S., "Functional Triple Modular Redundancy (FTMR)," Gaisler Research, FPGA-003-01, Version 0.2, Dec. 2002, 56 pages.

Iqbal, S., "Designing Fault Tolerant Data registers for Single Event Upsets," ResearchGate, Nov. 2014, freescale, 6 pages.

Teifel, J. Phd, "Self-Voting Dual-Modular-Redundancy Circuits for Single-Event-Transient Mitigation," SAND2008-4283C, NSREX-08, NNSA, Dec. 2008, 15 pages.

Wikipedia, "Triple modular redundancy," https://en.wikipedia.org/wiki/Triple_modular_redundancy, downloaded on Jan. 27, 2022, 5 pages.

Aditya Jagirdar et al., "A Robust Architecture for Flip-Flops Tolerant to Soft-Errors and Transients from Combinational Circuits," VLSI Design, 2008, 21ST International Conference on VLSI Design, IEEE, Piscataway, NJ, USA, Jan. 4, 2008, 6 pages.

* cited by examiner

PRIOR ART
Launch-on-Capture (LOC)

FIG. 1

PRIOR ART
Launch-on-Shift (LOS)

FIG. 2

PRIOR ART

REDUNDANCY CIRCUIT

TECHNICAL FIELD

The present disclosure relates generally to an electronic system and method, and, in particular embodiments, to a redundancy circuit.

BACKGROUND

Integrated circuits (ICs) are generally tested for faults. Logic circuits are commonly tested using a method often referred to as scan testing. During scan testing, patterns are shifted in through one or more chains of flip-flops (also referred to as a scan chains) to stimulate one or more logic circuits. Results from the stimulated logic circuits are loaded into the scan chains and are shifted out for evaluation. When the shifted out patterns match expected patterns (based on proper functionality of the one or more logic circuits), then no faults are detected and the circuit may be treated as defect-free. When the shifted out patterns do not match the expected patterns, then faults are detected.

Figure 1:
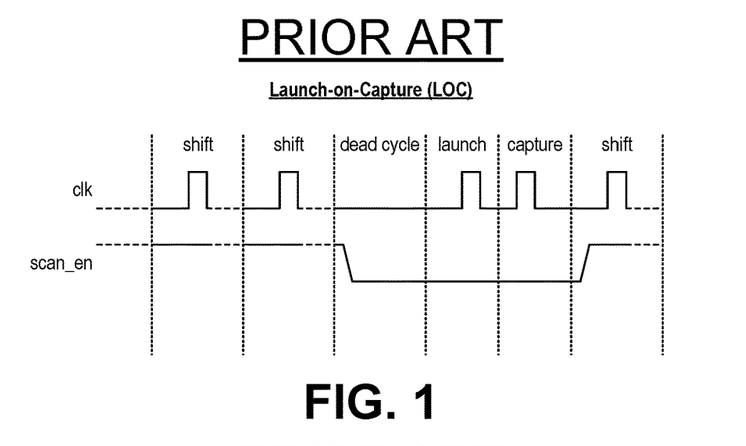
FIG. 1 shows exemplary launch-on-capture (LOC) waveforms of scan chain clock signal clk and scan enable signal scan_en.

FIG. 1 shows exemplary launch-on-capture (LOC) waveforms of scan chain clock signal clk and scan enable signal scan_en. As shown in FIG. 1, when scan_en is in a high state (also referred to as high, or logic 1), data (also referred to as test vectors, test patterns, vectors, or patterns) shifts into the scan chain each time clock signal clk pulses. When scan enable signal scan_en transitions to a low state (also referred to as low, or logic 0), the first pulse of clock signal clk causes the logic circuits having inputs coupled to the scan chain to transition in a step generally referred to as launch. The second pulse of clock signal clk causes the loading of the outputs of the stimulated logic circuits into flip-flops of the scan chain. Once scan enable signal scan_en transitions to the high state, data in the scan chain shifts out each time clock signal clk pulses. The data shifted out is then evaluated for faults.

The launch and capture clock pulses may be performed at-speed so that the logic circuits are tested for faults related to transition delays.

As can be seen in FIG. 1, LOC testing allows for shifting data into or out of the scan chain at slow speed while still performing at-speed testing of the logic circuits. Thus, in some implementations, LOC testing may allow for an easier implementation of the scan circuit (compared with LOS testing) since the scan enable signal scan_en transition may be slow.

Figure 2:
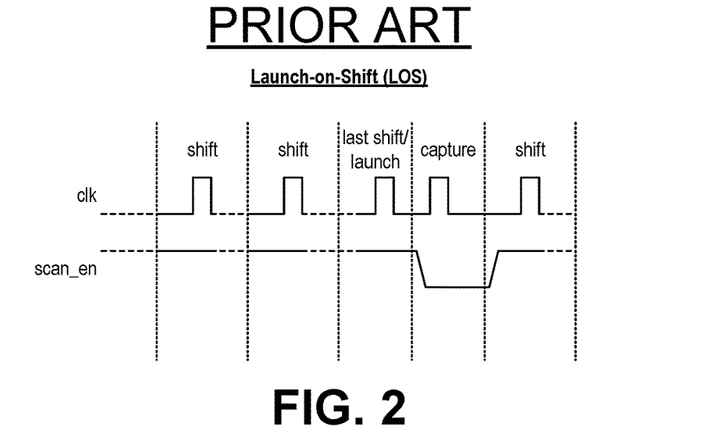
FIG. 2 shows exemplary launch-on-shift (LOS) waveforms of scan chain clock signal clk and scan enable signal scan_en.

FIG. 2 shows exemplary launch-on-shift (LOS) waveforms of scan chain clock signal clk and scan enable signal scan_en. As shown, LOS testing is very similar to LOC testing. However, LOS testing performs the launch operation during the last shift pulse of clock signal clk. Thus, as shown in FIG. 2, scan enable signal scan_en transitions to the low state after the last shift pulse of clock signal clk but before the capture pulse of clock signal clk.

In a similar manner as in LOC testing, LOS testing may be performed at-speed. Thus, in some implementations, the scan enable signal scan_en implementation is designed to transition fast enough to allow for at-speed testing during LOS.

As can be seen in FIG. 2, in some implementations, LOS testing may allow for lower test time (compared with LOC testing) since LOS testing uses the clock pulse for the last shift for both shifting data through the scan chain and for the launch operation.

Scan testing, e.g., with implementations as illustrated in FIGS. 1 and 2, may be implemented in an automated test equipment (ATE), where, e.g., the ATE provides the test vectors to the IC and evaluates the results (data shifted out) for determining faults. Scan testing may also be performed as a logic built-in-self-test (LBIST), where the IC applies the test vectors to itself (e.g., using a pseudorandom number generator) and determines whether a fault occurred by using an LBIST controller of the IC.

Scan testing and/or the performance of LBIST may provide a way of detecting the presence of faults.

In some applications, a circuit is expected to continue proper operation even in the presence of a fault. In such applications, a redundancy circuit may be used. This is typically true for safety sensitive automotive applications. Security features may also demand logic redundancy around critical bits, e.g., to prevent against adversary attacks.

Figure 3:
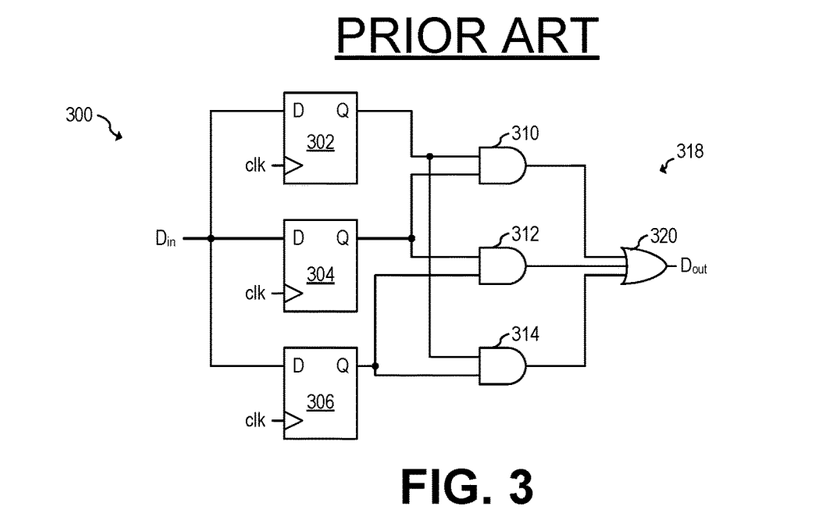
FIG. 3 shows a schematic diagram of an exemplary triple-voting flop.

A redundancy circuit may be understood as a fault tolerant circuit in which the circuit is capable of continued and proper operation in the presence of a fault. FIG. 3 shows a schematic diagram of exemplary triple-voting flop (TVF) 300, which is an example of a redundancy circuit. Triple-voting flop 300 includes D-flip-flops 302, 304, and 306, and voting circuit 318. Voting circuit 318 includes AND gates 310, 312, and 314, and OR gate 320.

Triple-voting flop 300 uses majority voting to determine output $D_{out}$. For example, when all D-flip-flops 302, 304, and 306 are operating properly, the content of each of D-flip-flops 302, 304, and 306 is the same, and the output $D_{out}$ is equal to the content of D-flip-flops 302, 304, and 306. If one of D-flip-flops 302, 304, or 306 outputs a wrong state, output $D_{out}$ continues to output the correct value (since the two other D-flip-flops of D-flip-flops 302, 304, and 306 output the correct value). For example, if D-flip-flops 302 and 304 output a logic 1 and D-flip-flop 306 flips and outputs a logic 0, the output of AND gate 310 is a logic 1, the output of each of AND gates 312 and 314 is a logic 0, and the output of OR gate 320 is a logic 1. If D-flip-flops 302 and 304 output a logic 0 and D-flip-flop 306 flips and outputs a logic 1, the output of each of AND gates 310, 312 and 314 is a logic 0, and the output of OR gate 320 is a logic 0.

Triple-voting flops may be used for safety sensitive bits, where an accidental flip of the bit (e.g., due to a soft error) cannot be tolerated. For example, triple-voting flop 300 may replace a D-flip-flop where redundancy of such D-flip-flop is desired.

SUMMARY

In accordance with an embodiment, an integrated circuit includes: a voting circuit including N scan flip-flops, where N is an odd number greater than or equal to 3, and where the N scan flip-flops includes a first scan flip-flop and a second scan flip-flop, where an output of the first scan flip-flop is coupled to a scan input of the second scan flip-flop; a scan chain including the N scan flip-flops of the voting circuit, and third and fourth scan flip-flops, the scan chain configured to receive a scan enable signal; and a scan enable control circuit configured to control a scan enable input of the first or second scan flip-flops based on the scan enable signal and based on a scan input of the third scan flip-flop or an output of the fourth scan flip-flop.

In accordance with an embodiment, an integrated circuit includes: a triple-voting flop including first, second, and third scan flip-flops, where an output of the first scan flip-flop is coupled to a scan input of the second scan flip-flop, and where an output of the second scan flip-flop is coupled to a scan input of the third scan flip-flop; a scan chain configured to receive a scan enable signal, the scan chain including the first, second, and third scan flip-flops of the triple-voting flop, the scan chain further including a fourth and a fifth scan flip-flops; and a scan enable control circuit configured to control a scan enable input of the first or third scan flip-flops based on the scan enable signal and based on a scan input of the fourth scan flip-flop or an output of the fifth scan flip-flop.

In accordance with an embodiment, a method for testing a triple-voting flop includes: providing a scan enable signal to a scan chain that includes first, second, third, fourth, fifth, and sixth scan flip-flops, where the triple-voting flop includes the first, second, and third scan flip-flops, where an output of the first scan flip-flop is coupled to a scan input of the second scan flip-flop, where an output of the second scan flip-flop is coupled to a scan input of the third scan flip-flop, and where an output of the third scan flip-flop is coupled to a scan input of the sixth scan flip-flop; providing a scan input signal to the scan chain; controlling a scan enable input of the first scan flip-flop based on the scan enable signal and based on a scan input of the fourth scan flip-flop; controlling a scan enable input of the third scan flip-flop based on the scan enable signal and based on an output of the fifth scan flip-flop; receiving a scan output signal from the scan chain; and determining whether there is a fault in the triple-voting flop based on the scan output signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a triple-voting flop capable of improved scan coverage, e.g., for automotive applications. Some embodiments may be implemented with other types of voting flops, such as with N-voting flops, where N is an odd number greater than 3. Some embodiments may be implemented in applications other than automotive, such as industrial applications, space applications, or any other applications that could benefit from improved scan coverage of a voting flop.

Figure 4:
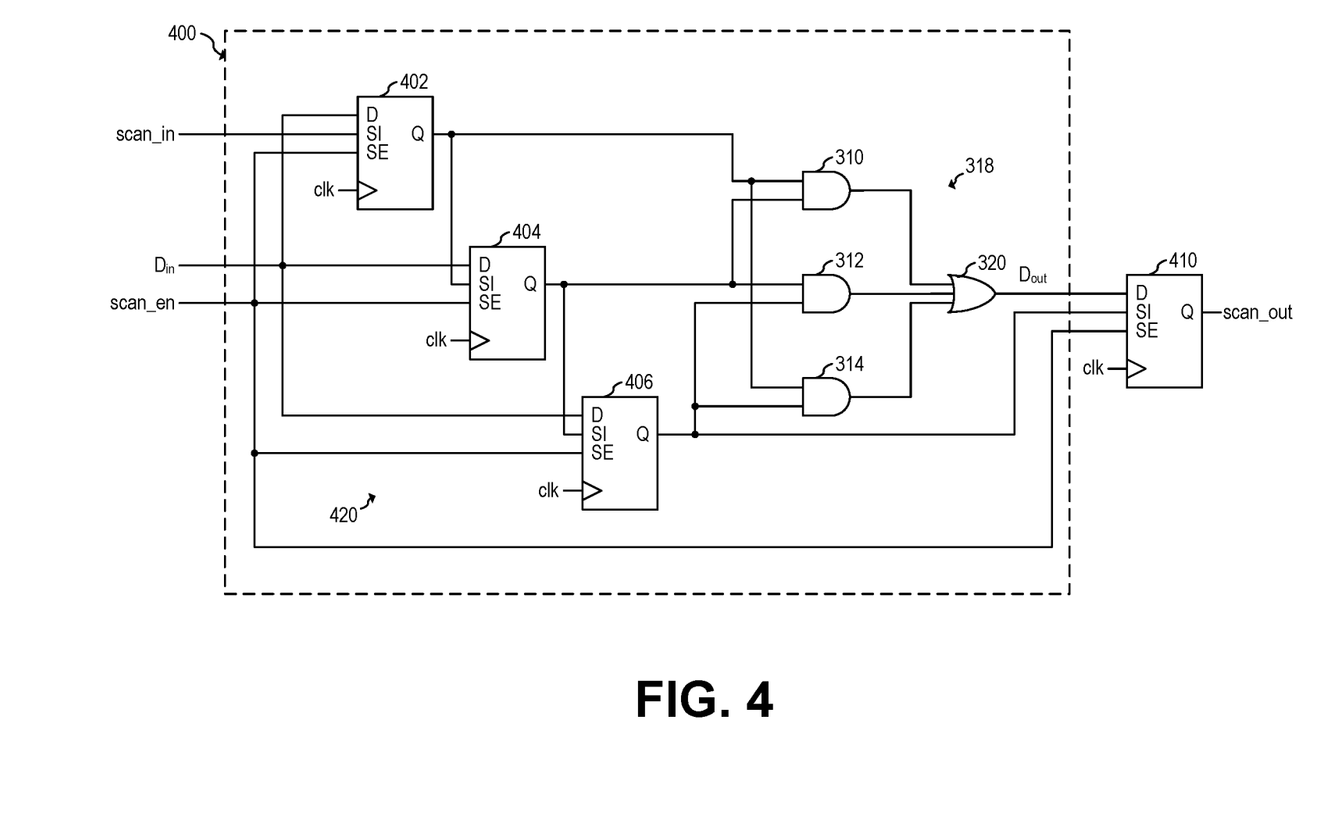
FIG. 4 shows a schematic diagram an exemplary triple-voting flop with scan flip flops.

It may be desirable to test, e.g., with 100% coverage, a voting flop such as triple-voting flop 100 using scan. However, achieving 100% at-speed (transition) coverage may be challenging. For example, FIG. 4 shows exemplary triple-voting flop 400 with scan flip flops. Triple-voting flop 400 is structurally similar to triple-voting flop 300. Triple-voting flop 400, however, replaces D-flip-flops 302, 304, and 306 with scan flip-flops 402, 404, and 406, respectively. An additional scan flip-flop 410 is used to capture the output of OR gate 320. As shown in FIG. 4, scan flip-flops 402, 404, 406, and 410 are connected to form a portion of scan chain 420.

The operation of each of scan flip-flops 402, 404, 406, and 410 is as follows. When the scan enable input SE is deasserted (e.g., low), the scan flip-flop latches the content of its D input and outputs it at its output Q during each clock pulse of clock signal clk. When the scan enable input SE is asserted (e.g., high), the scan flip-flop latches the content at the scan in input SI and outputs it at the output Q during each pulse of clock clk. Thus, when scan enable signal scan_en is deasserted (e.g., low), each of scan flip-flops 402, 404, 406, and 410 latches the content at the respective D input and outputs it at the respective Q output during each pulse of clock clk. When scan enable signal scan_en is asserted (e.g., high), each of scan flip-flops 402, 404, 406, and 410 latches the content at the respective SI input and outputs it at the respective Q output during each pulse of clock clk.

During normal operation, scan enable signal scan_en is kept low and triple-voting flop 400 operates in similar manner as triple-voting flop 300.

During scan testing (during scan mode), if scan chain 420 implements LOC, data (e.g., a test pattern) is first loaded into scan flip-flops 402, 404, and 406 (during the shift pulses) from scan input signal scan_in. During the launch pulse, all of scan flip-flops 402, 404, and 406 latch the same content of input $D_{in}$ and outputs it in their respective outputs Q. During the capture pulse, the output of OR gate 320 is captured by scan flip-flop 410. Such output is then shifted out with further shift pulses and then may be compared with the expected output to determine if a fault of triple-voting flop 400 exists.

When scan chain 420 implements LOC, triple-voting flop 400 may achieve a fault coverage greater than 50% of triple-voting flop 400. However, it may be challenging to catch some faults of triple-voting flop 400. For example, during at-speed testing using LOC, to test a slow-to-rise fault at the output of scan flip-flop 402, scan flip-flop 402 is loaded with a logic 0 during the shift pulses. During the launch pulse, input $D_{in}$ provides a logic 1 to all scan flip-flops 402, 404, and 406. If scan flip-flop 402 is slow to rise but scan flip-flops 404 and 406 are operating properly, such slow-to-rise fault of scan flip-flop 402 is masked by the presence of logic 1 at outputs of scan flip-flops 404 and 406. Thus, a slow-to-rise fault at scan flip-flop 402 may be undetectable.

During scan mode, if scan chain 420 implements LOS, data is first loaded into scan flip-flops 402, 404, and 406 (during the shift pulses) from scan input signal scan_in. During the last shift/launch pulse, the content of each scan flip-flops 402, 404, and 406 is outputted at their respective outputs Q. During the capture pulse, the output of OR gate 320 is captured by scan flip-flop 410. Such output may then be compared with the expected output to determine if a fault of triple-voting flop 400 exists.

When scan chain 420 implements LOS, triple-voting flop 400 may achieve a fault coverage greater than 80% of triple-voting flop 400. However, it may be challenging to catch some faults of triple-voting flop 400. For example, during at-speed testing using LOS, to test a slow-to-fall fault at the output of scan flip-flop 402, scan flip-flops 402 and 404 are loaded with a logic 1 during the shift pulses (to cause the output of AND gate 310 to be a logic 1). During the last shift/launch pulse, scan flip-flop 402 is loaded with a logic 0. Such operation causes that during the last shift/launch pulse, scan flip-flop 402 transitions from a logic 1 to a logic 0, and the output of scan flip-flops 404 and 406 remain a logic 1, which causes the output of OR gate 320 to remain a 1. Thus, if scan flip-flop 402 is slow-to-fall but scan flip-flops 404 and 406 are operating properly, such slow-to-fall fault of scan flip-flop 402 is masked and may be undetectable.

In an embodiment of the present invention, a triple-voting flop is advantageously capable of improved coverage (e.g., 100% at-speed and stuck-at coverage) using LOC scan. The triple-voting flop includes first, second, and third scan flip-flops connected in a chain. A first logic circuit gates the scan enable input SE of the first scan flip-flop based on a scan input SI of a preceding scan flip-flop of the scan chain. A second logic circuit gates the scan enable input SE of the third scan flip-flop based on an output Q of a subsequent scan flip-flop of the scan chain. By controlling the scan enable inputs SE of the first and third scan flip-flops, some embodiments are advantageously capable of selectively disabling the scan enable input SE of the first and third scan flip-flops, thereby allowing flexibility to load independent values to the first, second, and third scan flip-flops, thereby allowing improved (e.g., at-speed) scan coverage of the first, second, and third scan flip-flops. By operating the scan using LOC, some embodiments advantageously allow for an easier implementation of the scan circuit (compared with LOS testing) since the scan enable signal scan_en transition may be slow.

Figure 5:
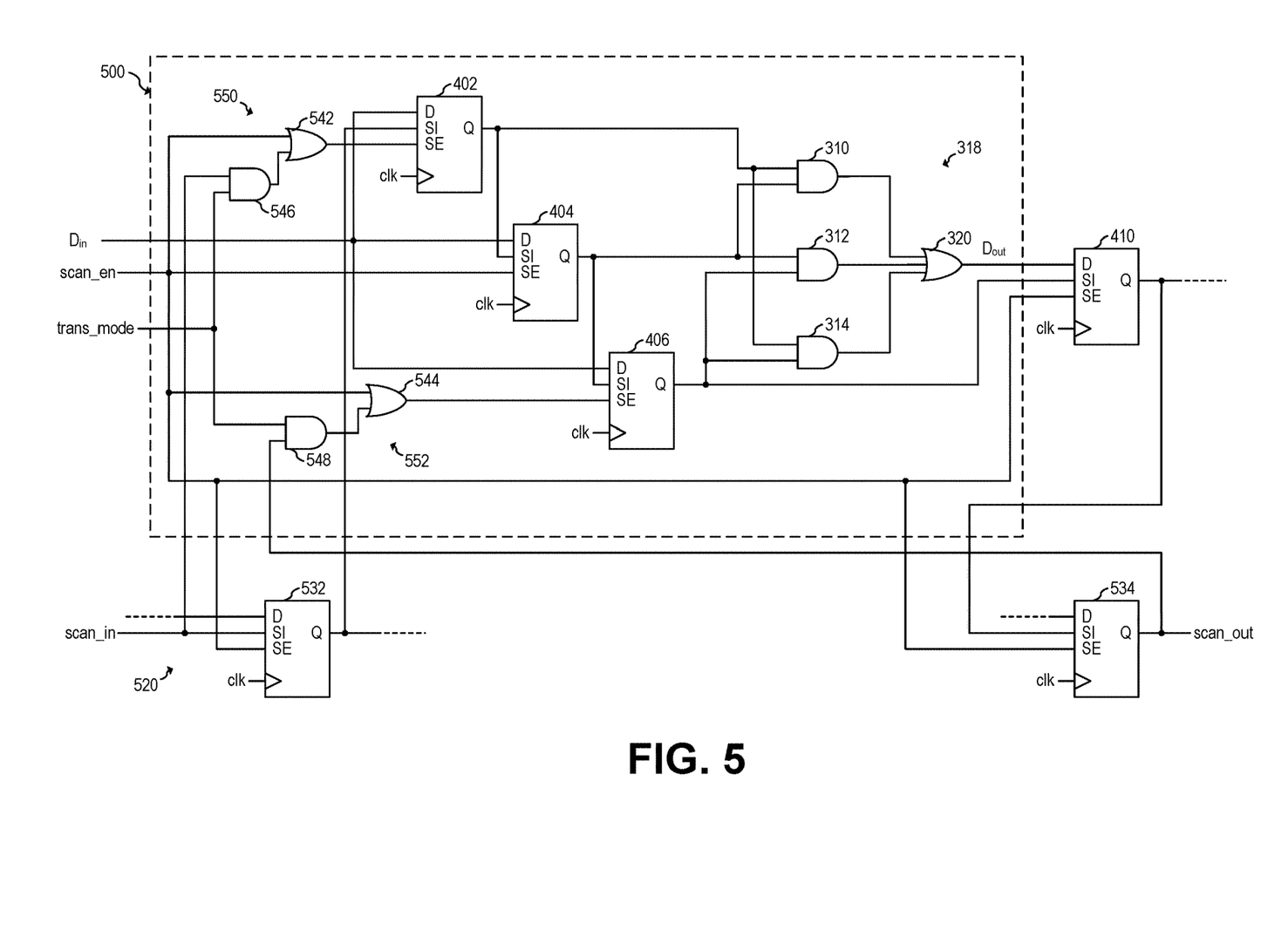
FIGS. 5 and 6 show schematic diagrams of triple-voting flops, according to embodiments of the present invention.

FIG. 5 shows a schematic diagram of triple-voting flop 500, according to an embodiment of the present invention. Triple-voting flop 500 includes scan flip-flops 402, 404, 406, voting circuit 318, and scan enable control circuits 550 and 552. Scan enable control circuit 550 includes AND gate 546 and OR gate 542. Scan enable control circuit 552 includes AND gate 548 and OR gate 544. As shown in FIG. 5, scan flip-flops 402, 404, 406, and 410 are connected to form a portion of scan chain 520, where scan chain 520 further includes scan flip-flops 532 and 534.

In some embodiments, during normal operation, scan enable signal scan_en is kept low, trans_mode signal is kept low, and triple-voting flop 500 operates in similar manner as triple-voting flop 300.

In some embodiments, during scan mode, scan chain 520 implements LOC. When trans_mode signal is kept low, the scan enable input SE of each of scan flip-flops 402, 404, 406, and 408 receives scan enable signal scan_en, and thus, operates in a similar manner as triple-voting flop 400 when triple-voting flop 400 operates with LOC.

When trans_mode signal is high, the scan enable inputs SE of scan flip-flops 402 and 406 are selectively controlled based on the scan input SI of scan flip-flop 532 and the output Q of scan flip-flop 534, respectively. Thus, in some embodiments, the content of scan flip-flops 402, 404, and 406 is independently controlled using trans_mode signal to achieve improved (e.g., at-speed) scan coverage, e.g., compared with triple-voting flop 400. For example, during at-speed testing using LOC, it is possible to test a slow-to-rise fault at the output of scan flip-flop 402. For example, during the shift pulses, scan flip-flops 402, 404, and 406 are loaded with logic 0. Before the launch pulse, the scan test pattern is designed such that the scan in input SI of scan flip-flop 532 is low and the output Q of scan flip-flop 534 is high while trans_mode signal is high. Thus, during the launch pulse, the scan enable input SE of scan flip-flops 402 and 404 is low and the scan enable input SE of scan flip-flop 406 is high. During the launch pulse, input $D_{in}$ provides a logic 1 to all scan flip-flops 402, 404, and 406. Since, the scan enable input SE of scan flip-flop 406 is low, the output Q of scan flip-flop 406 remains a logic 0 while the outputs Q of scan flip-flops 402 and 404 transition from low to high. If scan flip-flop 402 is slow to rise, such fault is propagated to the output of AND gate 310. Since the outputs of AND gates 312 and 314 are low (since the output of scan flip-flop 406 is low), the fault is also propagated to the output of OR gate 320, which is captured by scan flip-flop 410 during the capture pulse.

In some embodiments, scan test patterns can be designed, e.g., manually or with the aid of a conventional automated test pattern generator (ATPG), to advantageously achieve up to 100% stuck-at scan coverage and 100% at-speed scan coverage for triple-voting flop 500. For example, in some embodiments, all transitions (rising or falling) over every node of voting circuit 318 is tested to ensure that each transition occurs within a predetermined time.

In some embodiments, the additional logic (e.g., 542, 544, 546, and 548) introduced in triple-voting flop 500 is fully covered by scan (e.g., using scan flip-flops 402, 404, and 406 to capture the outputs of OR gates 542 and 544).

In some embodiments, the trans_mode signal is kept static (with the same value) through the execution of one or more (or all) scan test pattern (the trans_mode signal may have different states in different scan patterns, but may not change during the execution of each of the one or more (or all) scan test pattern).

In some embodiments, triple-voting flop 500 is implemented as part of an integrated circuit (IC). In some embodiments, scan test of triple-voting flop 500 is performed using an ATE (e.g., during production testing of the IC). In some embodiments, scan test of triple-voting flop 500 is performed using LBIST.

As shown in FIG. 5, in some embodiments, the output Q of scan flip-flop 532 may be connected to the scan input SI of scan flip-flop 402. In some embodiments, there may be additional scan flip-flops coupled between the output Q of scan flip-flop 532 and the scan in input SI of scan flip-flop 402.

As shown in FIG. 5, in some embodiments, the output Q of scan flip-flop 410 may be connected to the scan input SI of scan flip-flop 534. In some embodiments, there may be additional scan flip-flops coupled between the output Q of scan flip-flop 410 and the scan in input SI of scan flip-flop 534.

In some embodiments, scan flip-flops 402, 404, 406, 410, 532, and 534 may be implemented in any way known in the art.

Figure 6:
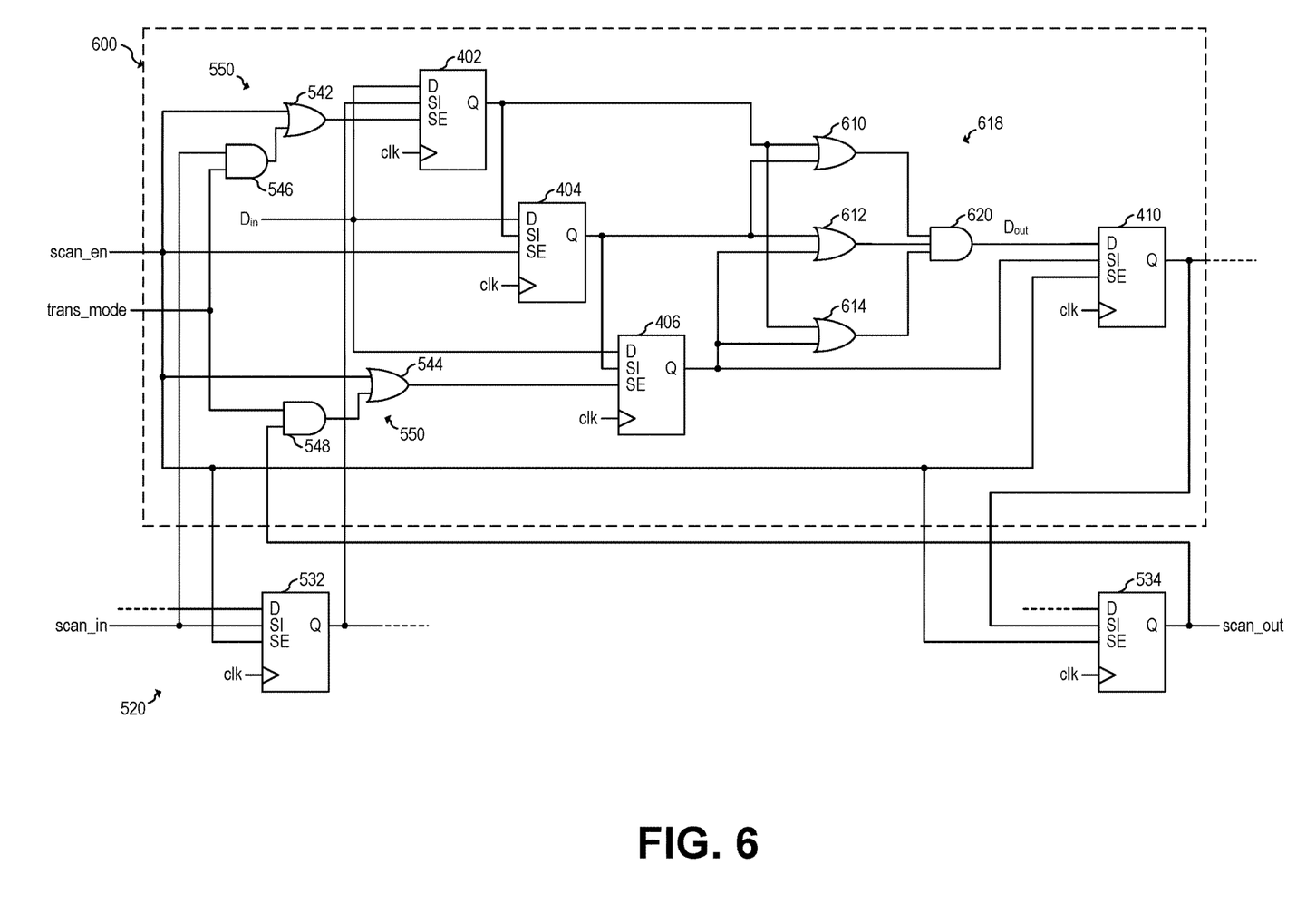

In some embodiments, a triple-voting flop with improved scan coverage may be implemented with voting circuit 318, as shown in FIG. 5. In some embodiments, a triple-voting flop with improved scan coverage may be implemented with different voting circuits. For example, FIG. 6 shows a schematic diagram of triple-voting flop 600, according to an embodiment of the present invention. Triple-voting flop 600 operates in a similar manner as triple-voting flop 500. Triple-voting flop 500, however, replaces voting circuit 318 with voting circuit 618.

In some embodiments, triple-voting flop 600 is capable of achieving improved (e.g., 100% at-speed and stuck-at coverage) using LOC scan in a similar manner as triple-voting flop 500.

Advantages of some embodiments include the capability of achieving improved scan coverage of a triple-voting flop with no impact on the functional path of the triple-voting flop (e.g., from the D input of scan flip-flops 402, 404, and 406 to the output of OR gate 320), and with no impact to scan-stitching. Some embodiments achieve the improved scan coverage with low area impact (e.g., only 4 logic gates added to the triple-voting flop). In some embodiments, the improved scan coverage of the triple-voting flop is achieved without routing fast signals (e.g., since scan is performed using LOC, and thus, scan enable signal scan_en may be a relatively slow signal, and since the trans_mode signal may be a static signal during scan testing).

Figure 7:
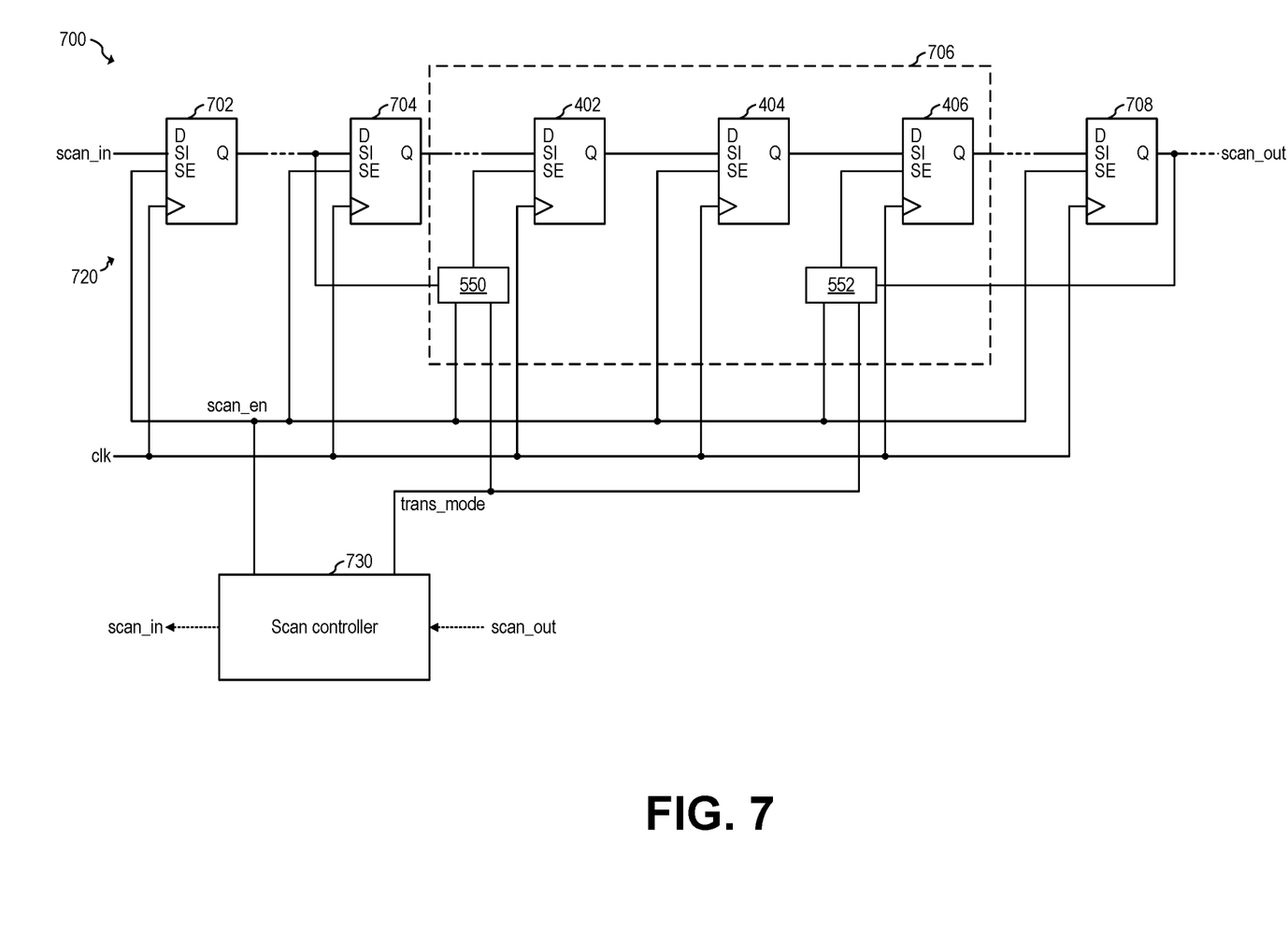
FIG. 7 shows a schematic diagram of an integrated circuit (IC), according to an embodiment of the present invention.

FIG. 7 shows a schematic diagram of IC 700, according to an embodiment of the present invention. IC 700 includes scan chain 720 and scan controller 730. Scan chain 720 includes scan flip-flops 702, 704, 402, 404, 406, and 708. IC 700 also includes triple-voting flop 706, which includes scan flip-flops 402, 404, and 406, and scan enable control circuits 550 and 552. In some embodiments, triple-voting flop 706 may be implemented as triple-voting flop 500 or 600.

As shown in FIG. 7, in some embodiments, scan enable control circuit 550 receives trans_mode signal, scan enable signal scan_en, and a control signal from a scan input SI of preceding scan flip-flop (704) and controls the scan enable input SE of scan flip-flop 402 based on the received signals. Scan enable control circuit 552 receives trans_mode signal, scan enable signal scan_en, and a control signal from a output Q of a subsequent scan flip-flop (708) and controls the scan enable input SE of scan flip-flop 406 based on the received signals.

In some embodiments, scan enable control circuit 550 may receive its control signal from a scan input SI or output Q of another scan flip-flop of scan chain 720, such as another scan flip-flop preceding triple-voting flop 706 or a scan flip-flop subsequent to triple voting flop 706. In some embodiments, scan enable control circuit 552 may receive its control signal from a scan input SI or output Q of another scan flip-flop of scan chain 720, such as another scan flip-flop preceding triple-voting flop 706 or a scan flip-flop subsequent to triple voting flop 706.

As shown in FIG. 7, in some embodiments, scan controller 730 performs LBIST by generating signals scan_en, trans_mode, and scan_in, testing triple-voting flop 706 using LOC, receiving signal scan_out, and determining whether a fault exist in triple-voting flop 706 based on output signal scan_out. In some embodiments, an ATE generates signals scan_in, scan_en, and trans_mode, receives signal scan_out, and determines whether a fault exist in voting circuit 706 based on signal scan_out.

In some embodiments, scan controller 730 may be implemented using digital circuits, such as with a finite state machine. In some embodiments, scan controller 730 may be implemented with a generic or custom micro-controller or processor coupled to a memory. Other implementations may also be possible.

Example embodiments of the present invention are summarized here. Other embodiments can also be understood from the entirety of the specification and the claims filed herein.

Example 1. An integrated circuit including: a voting circuit including N scan flip-flops, where N is an odd number greater than or equal to 3, and where the N scan flip-flops includes a first scan flip-flop and a second scan flip-flop, where an output of the first scan flip-flop is coupled to a scan input of the second scan flip-flop; a scan chain including the N scan flip-flops of the voting circuit, and third and fourth scan flip-flops, the scan chain configured to receive a scan enable signal; and a scan enable control circuit configured to control a scan enable input of the first or second scan flip-flops based on the scan enable signal and based on a scan input of the third scan flip-flop or an output of the fourth scan flip-flop.

Example 2. The integrated circuit of example 1, where the scan enable control circuit is configured to control the scan enable input of the first or second scan flip-flops based on the scan input of the third scan flip-flop or the output of the fourth scan flip-flop when a further signal is asserted.

Example 3. The integrated circuit of one of examples 1 or 2, where the scan enable control circuit is configured to control the scan enable input of the first and second scan flip-flops with the scan enable signal when the further signal is deasserted.

Example 4. The integrated circuit of one of examples 1 to 3, where the scan enable control circuit includes a first OR gate having an output coupled to the scan enable input of the first or second scan flip-flops, a first input configured to receive the scan enable signal, and a second input coupled to the scan input of the third scan flip-flop or to the output of the fourth scan flip-flop.

Example 5. The integrated circuit of one of examples 1 to 4, where the scan enable control circuit further includes a first AND gate having an output coupled to a second input of the first OR gate, a first input coupled to the scan input of the third scan flip-flop or to the output of the fourth scan flip-flop, and a second input configured to receive a further signal.

Example 6. The integrated circuit of one of examples 1 to 5, where the first input of the first AND gate is coupled to the scan input of the third scan flip-flop, and where the output of the first OR gate is coupled to the scan enable input of the first scan flip-flop, the scan enable control circuit further including: a second OR gate having an output coupled to the scan enable input of the second scan flip-flop, and a first input configured to receive the scan enable signal;

and a second AND gate having an output coupled to a second input of the second OR gate, a first input coupled to the output of the fourth scan flip-flop, and a second input configured to receive the further signal.

Example 7. The integrated circuit of one of examples 1 to 6, further including a scan controller configured to provide the scan enable signal to the scan chain.

Example 8. The integrated circuit of one of examples 1 to 7, where, when the integrated circuit is in scan mode, the scan controller is configured to provide a scan input signal to the scan chain, receive a scan output signal from the scan chain, and determine whether there is a fault in the voting circuit based on the scan output signal.

Example 9. The integrated circuit of one of examples 1 to 8, where the second scan flip-flop is a last scan flip-flop of the N scan flip-flops of the voting circuit.

Example 10. The integrated circuit of one of examples 1 to 9, where an output of the second scan flip-flop is coupled to a scan input of the fourth scan flip-flop.

Example 11. The integrated circuit of one of examples 1 to 10, where an output of the third scan flip-flop is coupled to a scan input of the first scan flip-flop.

Example 12. The integrated circuit of one of examples 1 to 11, where the output of the third scan flip-flop is directly connected to the scan input of the first scan flip-flop.

Example 13. The integrated circuit of one of examples 1 to 12, where N is equal to 3.

Example 14. An integrated circuit including: a triple-voting flop including first, second, and third scan flip-flops, where an output of the first scan flip-flop is coupled to a scan input of the second scan flip-flop, and where an output of the second scan flip-flop is coupled to a scan input of the third scan flip-flop; a scan chain configured to receive a scan enable signal, the scan chain including the first, second, and third scan flip-flops of the triple-voting flop, the scan chain further including a fourth and a fifth scan flip-flops; and a scan enable control circuit configured to control a scan enable input of the first or third scan flip-flops based on the scan enable signal and based on a scan input of the fourth scan flip-flop or an output of the fifth scan flip-flop.

Example 15. The integrated circuit of example 14, where the triple-voting flop includes: a first AND gate having a first input coupled to the output of the first scan flip-flop, and a second input coupled to the output of the second scan flip-flop; a second AND gate having a first input coupled to the output of the second scan flip-flop, and a second input coupled to an output of the third scan flip-flop; a third AND gate having a first input coupled to the output of the first scan flip-flop, and a second input coupled to the output of the third scan flip-flop; and an OR gate having a first input coupled to an output of the first AND gate, a second input coupled to an output of the second AND gate, and a third input coupled to an output of the third AND gate.

Example 16. The integrated circuit of one of examples 14 or 15, where triple-voting flop includes: a first OR gate having a first input coupled to the output of the first scan flip-flop, and a second input coupled to the output of the second scan flip-flop; a second OR gate having a first input coupled to the output of the second scan flip-flop, and a second input coupled to an output of the third scan flip-flop; a third OR gate having a first input coupled to the output of the first scan flip-flop, and a second input coupled to the output of the third scan flip-flop; and an AND gate having a first input coupled to an output of the first OR gate, a second input coupled to an output of the second OR gate, and a third input coupled to an output of the third OR gate.

Example 17. A method for testing a triple-voting flop, the method including: providing a scan enable signal to a scan chain that includes first, second, third, fourth, fifth, and sixth scan flip-flops, where the triple-voting flop includes the first, second, and third scan flip-flops, where an output of the first scan flip-flop is coupled to a scan input of the second scan flip-flop, where an output of the second scan flip-flop is coupled to a scan input of the third scan flip-flop, and where an output of the third scan flip-flop is coupled to a scan input of the sixth scan flip-flop; providing a scan input signal to the scan chain; controlling a scan enable input of the first scan flip-flop based on the scan enable signal and based on a scan input of the fourth scan flip-flop; controlling a scan enable input of the third scan flip-flop based on the scan enable signal and based on an output of the fifth scan flip-flop; receiving a scan output signal from the scan chain; and determining whether there is a fault in the triple-voting flop based on the scan output signal.

Example 18. The method of example 17, further including providing a further signal to the scan chain, where controlling the scan enable input of the first scan flip-flop is further based on the further signal, and where controlling the scan enable input of the third scan flip-flop is further based on the further signal.

Example 19. The method of one of examples 17 or 18, further including: asserting the scan enable signal; asserting the further signal; providing a clock signal to the scan chain; while the scan enable and further signals are asserted, pulsing the clock signal to shift into the scan chain a first test pattern based on the scan input signal; after shifting the first test pattern into the scan chain and while keeping the further signal asserted, deasserting the scan enable signal and pulsing the clock signal twice to capture an output of the triple-voting flop with the sixth scan flip-flop; and after capturing the output of the triple-voting flop, asserting the scan enable signal and pulsing the clock signal to generate the scan output signal.

Example 20. The method of one of examples 17 to 19, where determining whether there is a fault in the triple-voting flop includes verifying that all rising and falling transitions of every output node of the triple-voting flop occur within a predetermined time.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. An integrated circuit comprising:
   a voting circuit comprising N scan flip-flops, wherein N is an odd number greater than or equal to 3, and wherein the N scan flip-flops comprises a first scan flip-flop and a second scan flip-flop, wherein an output of the first scan flip-flop is coupled to a scan input of the second scan flip-flop;
   a scan chain comprising the N scan flip-flops of the voting circuit, and third and fourth scan flip-flops, the scan chain configured to receive a scan enable signal; and
   a scan enable control circuit configured to control a scan enable input of the first or second scan flip-flops based on the scan enable signal and based on a scan input of the third scan flip-flop or an output of the fourth scan flip-flop.

2. The integrated circuit of claim 1, wherein the scan enable control circuit is configured to control the scan enable input of the first or second scan flip-flops based on the scan input of the third scan flip-flop or the output of the fourth scan flip-flop when a further signal is asserted.

3. The integrated circuit of claim 2, wherein the scan enable control circuit is configured to control the scan enable input of the first and second scan flip-flops with the scan enable signal when the further signal is deasserted.

4. The integrated circuit of claim 1, wherein the scan enable control circuit comprises a first OR gate having an output coupled to the scan enable input of the first or second scan flip-flops, a first input configured to receive the scan enable signal, and a second input coupled to the scan input of the third scan flip-flop or to the output of the fourth scan flip-flop.

5. The integrated circuit of claim 4, wherein the scan enable control circuit further comprises a first AND gate having an output coupled to a second input of the first OR gate, a first input coupled to the scan input of the third scan flip-flop or to the output of the fourth scan flip-flop, and a second input configured to receive a further signal.

6. The integrated circuit of claim 5, wherein the first input of the first AND gate is coupled to the scan input of the third scan flip-flop, and wherein the output of the first OR gate is coupled to the scan enable input of the first scan flip-flop, the scan enable control circuit further comprising:
a second OR gate having an output coupled to the scan enable input of the second scan flip-flop, and a first input configured to receive the scan enable signal; and
a second AND gate having an output coupled to a second input of the second OR gate, a first input coupled to the output of the fourth scan flip-flop, and a second input configured to receive the further signal.

7. The integrated circuit of claim 1, further comprising a scan controller configured to provide the scan enable signal to the scan chain.

8. The integrated circuit of claim 7, wherein, when the integrated circuit is in scan mode, the scan controller is configured to provide a scan input signal to the scan chain, receive a scan output signal from the scan chain, and determine whether there is a fault in the voting circuit based on the scan output signal.

9. The integrated circuit of claim 1, wherein the second scan flip-flop is a last scan flip-flop of the N scan flip-flops of the voting circuit.

10. The integrated circuit of claim 1, wherein an output of the second scan flip-flop is coupled to a scan input of the fourth scan flip-flop.

11. The integrated circuit of claim 1, wherein an output of the third scan flip-flop is coupled to a scan input of the first scan flip-flop.

12. The integrated circuit of claim 11, wherein the output of the third scan flip-flop is directly connected to the scan input of the first scan flip-flop.

13. The integrated circuit of claim 1, wherein N is equal to 3.

14. An integrated circuit comprising:
a triple-voting flop comprising first, second, and third scan flip-flops, wherein an output of the first scan flip-flop is coupled to a scan input of the second scan flip-flop, and wherein an output of the second scan flip-flop is coupled to a scan input of the third scan flip-flop;
a scan chain configured to receive a scan enable signal, the scan chain comprising the first, second and third scan flip-flops of the triple-voting flop, the scan chain further comprising a fourth and a fifth scan flip-flops; and
a scan enable control circuit configured to control a scan enable input of the first or third scan flip-flops based on the scan enable signal and based on a scan input of the fourth scan flip-flop or an output of the fifth scan flip-flop.

15. The integrated circuit of claim 14, wherein the triple-voting flop comprises:
a first AND gate having a first input coupled to the output of the first scan flip-flop, and a second input coupled to the output of the second scan flip-flop;
a second AND gate having a first input coupled to the output of the second scan flip-flop, and a second input coupled to an output of the third scan flip-flop;
a third AND gate having a first input coupled to the output of the first scan flip-flop, and a second input coupled to the output of the third scan flip-flop; and
an OR gate having a first input coupled to an output of the first AND gate, a second input coupled to an output of the second AND gate, and a third input coupled to an output of the third AND gate.

16. The integrated circuit of claim 14, wherein triple-voting flop comprises:
a first OR gate having a first input coupled to the output of the first scan flip-flop, and a second input coupled to the output of the second scan flip-flop;
a second OR gate having a first input coupled to the output of the second scan flip-flop, and a second input coupled to an output of the third scan flip-flop;
a third OR gate having a first input coupled to the output of the first scan flip-flop, and a second input coupled to the output of the third scan flip-flop; and
an AND gate having a first input coupled to an output of the first OR gate, a second input coupled to an output of the second OR gate, and a third input coupled to an output of the third OR gate.

17. A method for testing a triple-voting flop, the method comprising:
providing a scan enable signal to a scan chain that comprises first, second, third, fourth, fifth, and sixth scan flip-flops, wherein the triple-voting flop comprises the first, second, and third scan flip-flops, wherein an output of the first scan flip-flop is coupled to a scan input of the second scan flip-flop, wherein an output of the second scan flip-flop is coupled to a scan input of the third scan flip-flop, and wherein an output of the third scan flip-flop is coupled to a scan input of the sixth scan flip-flop;
providing a scan input signal to the scan chain;
controlling a scan enable input of the first scan flip-flop based on the scan enable signal and based on a scan input of the fourth scan flip-flop;
controlling a scan enable input of the third scan flip-flop based on the scan enable signal and based on an output of the fifth scan flip-flop;
receiving a scan output signal from the scan chain; and
determining whether there is a fault in the triple-voting flop based on the scan output signal.

18. The method of claim 17, further comprising providing a further signal to the scan chain, wherein controlling the scan enable input of the first scan flip-flop is further based on the further signal, and wherein controlling the scan enable input of the third scan flip-flop is further based on the further signal.

19. The method of claim 18, further comprising:
asserting the scan enable signal;
asserting the further signal;
providing a clock signal to the scan chain;
while the scan enable and further signals are asserted, pulsing the clock signal to shift into the scan chain a first test pattern based on the scan input signal;
after shifting the first test pattern into the scan chain and while keeping the further signal asserted, deasserting the scan enable signal and pulsing the clock signal twice to capture an output of the triple-voting flop with the sixth scan flip-flop; and
after capturing the output of the triple-voting flop, asserting the scan enable signal and pulsing the clock signal to generate the scan output signal.

20. The method of claim 17, wherein determining whether there is a fault in the triple-voting flop comprises verifying that all rising and falling transitions of every output node of the triple-voting flop occur within a predetermined time.

* * * * *